United States Patent
Lee et al.

(10) Patent No.: US 7,193,322 B2
(45) Date of Patent: Mar. 20, 2007

(54) SACRIFICIAL SHALLOW TRENCH ISOLATION OXIDE LINER FOR STRAINED-SILICON CHANNEL CMOS DEVICES

(75) Inventors: Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 102 days.

(21) Appl. No.: 10/985,462

(22) Filed: Nov. 9, 2004

(65) Prior Publication Data

US 2005/0101077 A1    May 12, 2005

Related U.S. Application Data

(62) Division of application No. 10/345,728, filed on Jan. 17, 2003, now Pat. No. 6,825,086.

(51) Int. Cl.
  *H01L 23/48* (2006.01)
  *H01L 23/52* (2006.01)
  *H01L 29/40* (2006.01)

(52) U.S. Cl. ............... 257/745; 257/204; 257/347; 257/616; 257/E21; 257/92; 257/115; 257/585; 257/632

(58) Field of Classification Search ........... 257/745, 257/742, 743, 510, 615, 616, 347, 549, 550, 257/622, 204
See application file for complete search history.

(56) References Cited

U.S. PATENT DOCUMENTS

| | | | |
|---|---|---|---|
| 6,194,285 B1 * | 2/2001 | Lin et al. | 438/424 |
| 6,600,170 B1 * | 7/2003 | Xiang | 257/18 |
| 6,677,192 B1 * | 1/2004 | Fitzgerald | 438/172 |
| 6,696,348 B1 * | 2/2004 | Xiang | 438/424 |
| 6,723,661 B2 * | 4/2004 | Fitzergald | 438/763 |
| 6,787,423 B1 * | 9/2004 | Xiang | 438/296 |
| 6,897,122 B1 * | 5/2005 | Xiang | 438/424 |

* cited by examiner

*Primary Examiner*—David Nhu
(74) *Attorney, Agent, or Firm*—Law Office of Gerald Maliszewski; Gerald Maliszewski

(57) ABSTRACT

A strained-silicon (Si) channel CMOS device shallow trench isolation (STI) oxide region, and method for forming same have been provided. The method forms a Si substrate with a relaxed-SiGe layer overlying the Si substrate, or a SiGe on insulator (SGOI) substrate with a buried oxide (BOX) layer. The method forms a strained-Si layer overlying the relaxed-SiGe layer; a silicon oxide layer overlying the strained-Si layer, a silicon nitride layer overlying the silicon oxide layer, and etches the silicon nitride layer, the silicon oxide layer, the strained-Si layer, and the relaxed-SiGe layer, forming a STI trench with trench corners and a trench surface. The method forms a sacrificial oxide liner on the STI trench surface. In response to forming the sacrificial oxide liner, the method rounds and reduces stress at the STI trench corners, removes the sacrificial oxide liner, and fills the STI trench with silicon oxide.

18 Claims, 4 Drawing Sheets

SACRIFICIAL SHALLOW TRENCH ISOLATION OXIDE LINER FOR STRAINED-SILICON CHANNEL CMOS DEVICES

RELATED APPLICATIONS

This application is a Divisional Application of a patent application entitled, STRAINED-SILICON CHANNEL CMOS WITH SACRIFICIAL SHALLOW TRENCH ISOLATION OXIDE LINER, invented by Lee et al., Ser. No. 10/345,728, filed Jan. 17, 2003 U.S. Pat. No. 6,825,086.

BACKGROUND OF THE INVENTION

1. Field of the Invention

This invention generally relates to integrated circuit fabrication and, more particularly, to a strained-silicon (Si) channel CMOS device that has shallow trench isolation (STI) regions formed with an oxide liner.

2. Description of the Related Art

In the process of trenching for a STI region, damage can occur in the exposed silicon-containing layers. A STI liner oxidation process is typically carried out at 800–1000 degrees C., growing a 100–300 Å thick layer of SiO2. This oxidation process cures the damaged Si, rounding the STI top and bottom corners and reducing the stress at trench corners. The Si curing induced by this STI liner oxidation step can reduce the device junction leakage up to several orders of magnitude.

For strained-Si channel complementary metal gate over oxide over silicon (CMOS) field effect transistor (FET) processes, the thin layer of strained-Si is deposited on a layer of relaxed silicon germanium (SiGe). Then, the above-described oxidation process can lead to other problems. The exposure of SiGe, in the trenching process and the oxidation ambient environment as the liner oxide is grown, generally results in Ge precipitation into the SiO2 matrix. This Ge precipitation degrades the device performance with respect to junction leakage and device reliability.

It would be advantageous if an oxidation curing process could be performed after a STI trenching, when SiGe layers are etching.

It would be advantageous if a procedure could be developed that prevented the precipitation of Ge, from a SiGe layer, in the oxidation curing of a STI trench.

It would be advantageous if the above-mentioned procedure could be performed using primarily conventional procedures.

SUMMARY OF THE INVENTION

This present invention solves the above-mentioned Ge precipitation problem by growing a sacrificial (temporary) liner oxide, and removing it, after curing the damaged Si in an STI trench. As mentioned above, the curing removes damaged Si, rounds the STI top/bottom corners, and reduces the stress at trench corners. In some aspects, a very thin liner oxide (<100 Å) is regrown as the barrier to the CVD oxide deposited in the STI trench.

Accordingly, a method is provided for forming a sacrificial STI oxide liner in a strained-silicon channel CMOS device using a relaxed-SiGe layer. The method comprises: forming a Si substrate; and, forming a relaxed-SiGe layer overlying the Si substrate. In some aspects the Si substrate is a bulk Si substrate. In other aspects, the relaxed-SiGe layer is formed over an interposing buried oxide (BOX) layer to form a SiGe on insulator (SGOI) substrate.

The method further comprises: forming a strained-Si layer overlying the relaxed-SiGe layer; forming a silicon oxide layer overlying the strained-Si layer; forming a silicon nitride layer overlying the silicon oxide layer; etching the silicon nitride layer, the silicon oxide layer, the strained-Si layer, and the relaxed-SiGe layer, forming a STI trench with trench corners and a trench surface; forming a sacrificial oxide liner on the STI trench surface; in response to forming the sacrificial oxide liner, rounding and reducing stress at the STI trench corners; removing the sacrificial oxide liner; and, filling the STI trench with silicon oxide.

Typically, the sacrificial oxide liner on the STI trench surface has a thickness in the range of 20 to 300 Å, formed through a thermal oxidation process at a temperature in the range of 300 to 1100 degrees C. The sacrificial oxide liner is moved using either a hydrofluoric (HF) vapor or an HF solution.

In some aspects of the method, the SiGe layer is formed as a SiGe layer having a top surface with a Ge content in the range between 10 and 50%. The SiGe layer can either have a variably graded Ge content, or a constant content throughout the SiGe layer thickness. When the Si substrate is bulk Si, the SiGe layer has a thickness in the range of 0.1 micron to 7 microns. When, a SGOI substrate is used, the SiGe layer has a thickness in the range of 0.005 to 0.5 microns, and the STI trench bottom is formed in the BOX underlying the relaxed-SiGe layer.

Some aspects of the method include further steps comprising: following the removal of the sacrificial oxide liner, forming a permanent oxide liner on the STI trench surface, typically with a thickness of less than 100 Å. Then, filling the STI trench with silicon oxide includes depositing silicon oxide in the STI trench overlying the permanent oxide liner.

Additional details of the above-described method and a strained-Si channel CMOS device STI oxide region are described below.

DETAILED DESCRIPTION OF THE PREFERRED EMBODIMENTS

Figure 1:
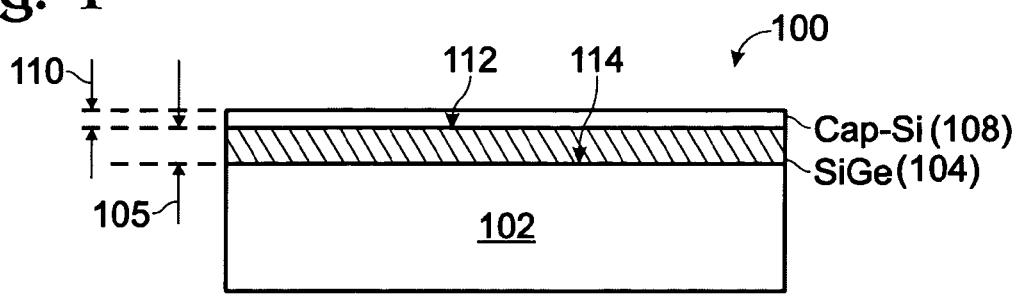
FIGS. 1 through 9 shows steps in the formation of the present invention strained-silicon (Si) channel CMOS device shallow trench isolation (STI) oxide region.

FIGS. 1 through 9 shows steps in the formation of the present invention strained-silicon (Si) channel CMOS device shallow trench isolation (STI) oxide region. FIG. 1 is a partial cross-sectional view of the process for forming a STI oxide region 100 that begins with a single crystal bulk Si wafer 102, either n-type of p-type. An alternate SiGe on insulator process is described in FIG. 10. When the SiGe 104 is epitaxially grown, it is initially strained, but is relaxed in subsequent processes. Typically, the relaxation process occurs before the deposition of the strained-Si (described below). In other aspects, the SiGe layer is initially formed in the relaxed state. The SiGe layer 104 typically has a thickness 105 in the range of 0.1 microns to 7 microns. A strained-Si layer 108 with a thickness 110 in the range of 30 to 300 Å is epitaxially grown on the SiGe layer 104. The SiGe layer 104 has a top surface 112 with a Ge content in the range between 10 and 50%. In some aspects, the SiGe layer 104 has a variably graded Ge content between a bottom surface 114 and the top surface 112. In other aspects, the Ge content is consistent through the SiGe layer thickness 105.

Figure 2:
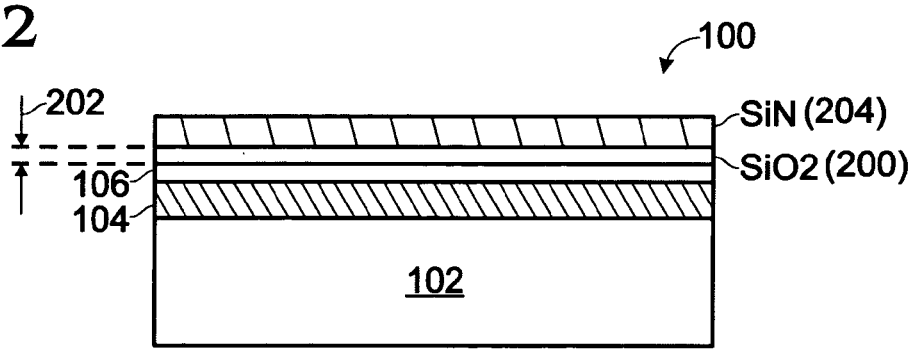

FIG. 2 is a partial cross-sectional view of FIG. 1 following the growth of an (pad) oxide level 200 having a thickness 202 in the range of 30 to 300 Å. Then, silicon nitride (Si3N4) 204 is deposited. Both these layers 200/204 are temporary in that they are removed in subsequent processes.

Figure 3:
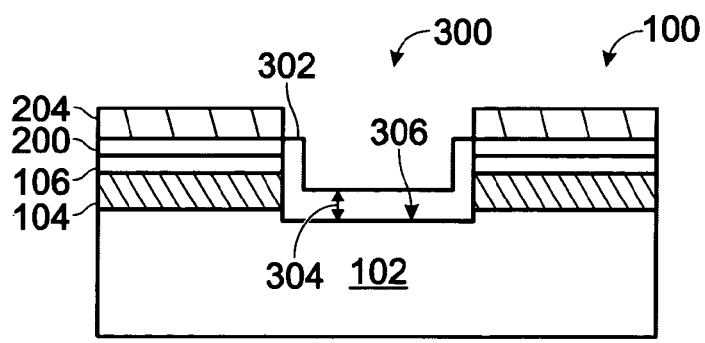

FIG. 3 is a partial cross-sectional view of FIG. 2 following an STI etching to form a trench 300. After the trench 300 is formed, a sacrificial oxide liner 302 is formed having a thickness 304 in the range of 20 to 300 Å. Typically, the sacrificial oxide 302 is formed at a temperature in the range between 300 and 1100 degrees C. The STI trench 300 has a trench bottom 306 etched through the silicon nitride layer 204, the silicon oxide layer 200, the strained-Si layer 106, the SiGe layer 104, and a portion of the Si substrate 102. Alternately but not shown, the trench bottom may be formed in the SiGe layer 104, instead of the Si substrate 102. As shown, the sacrificial oxide liner 302 is formed on layers 104, 106, and 200 in the trench sidewall, and over the STI trench bottom 306.

Figure 4:
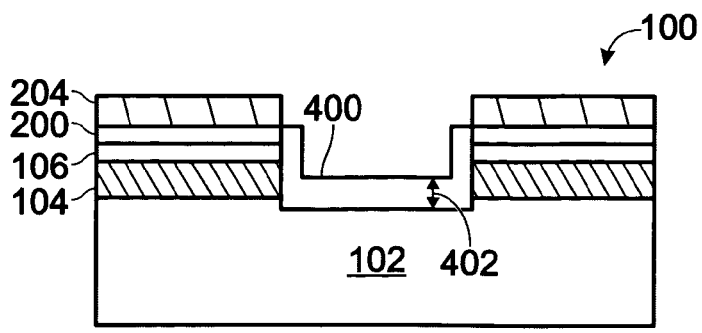

FIG. 4 is a partial cross-sectional view of FIG. 3 following the removal of the sacrificial oxide layer. The sacrificial oxide layer is typically removed with an HF dip off, or equivalent process. In some aspects (as shown), a permanent oxide liner 400 is grown, having a thickness 402 of less than 100 Å.

Figure 5:
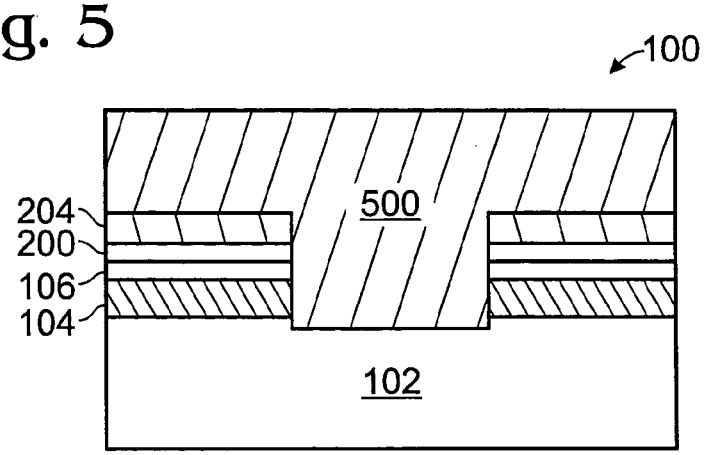

FIG. 5 is a partial cross-sectional view of FIG. 4 following an oxide 500 trench fill process.

Figure 6:
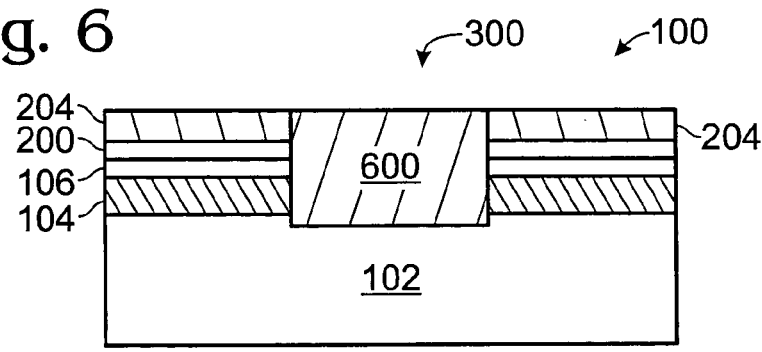

FIG. 6 is a partial cross-sectional view of FIG. 5 following a chemical mechanical polishing (CMP) process. The silicon oxide is polished down to the silicon nitride layer 204. The remaining oxide in the trench 300 is an STI region 600.

Figure 7:
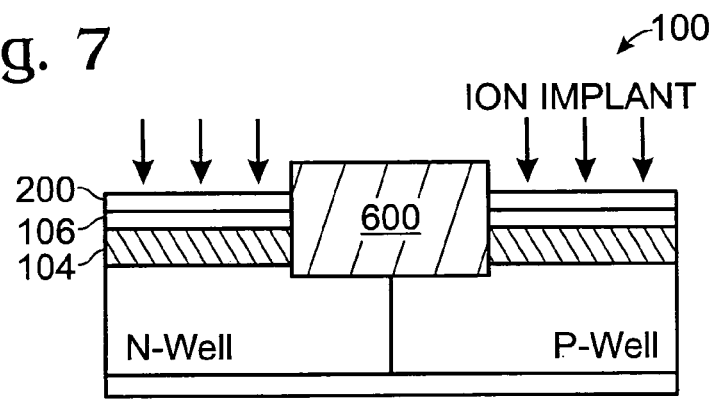

FIG. 7 is a partial cross-sectional view of FIG. 6 showing a conventional ion implantation. The silicon nitride is removed and a well implantation process is performed, followed by an ion activation process. For example, a rapid thermal annealing (RTA) process can be performed at a temperature between 900 and 1000 degrees C., for 5 to 60 seconds. Other conventional implantation processes are also practical.

Figure 8:
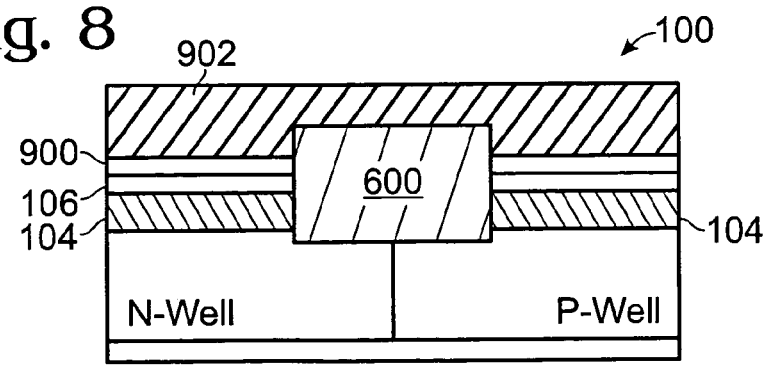

FIG. 8 is a partial cross-sectional view of FIG. 7 following the removal of the (pad) oxide layer. A gate oxidation layer 900 is formed, followed by a polysilicon deposition 902.

Figure 9:
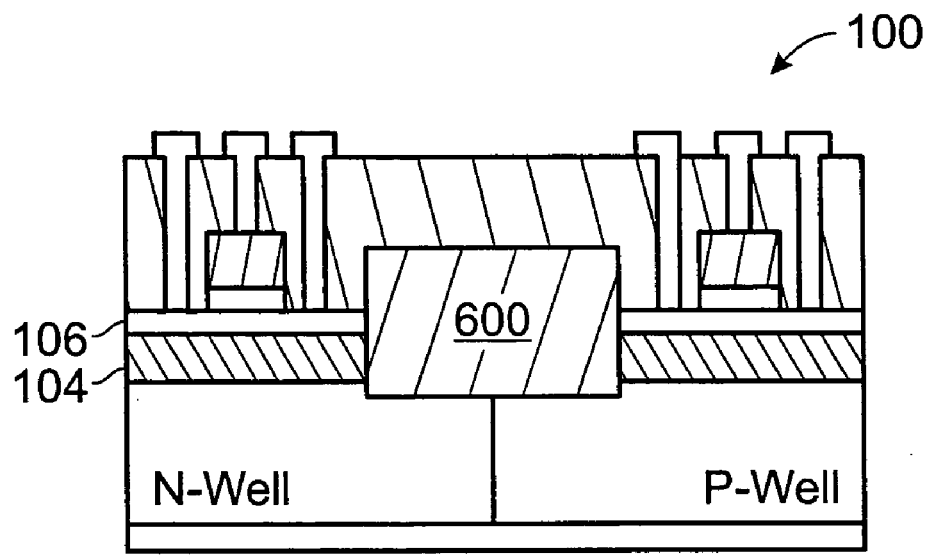

FIG. 9 is a partial cross-sectional view of FIG. 8 following an etch of the polysilicon 902. Then, standard CMOS device fabrication steps are performed including: a lightly doped drain (LDD) implantation, Halo implantations, gate spacer formation, source/drain implantation and activation, metal salicidation, inter-layer dielectric deposition, contact formation, and metal and via formations.

Figure 10:
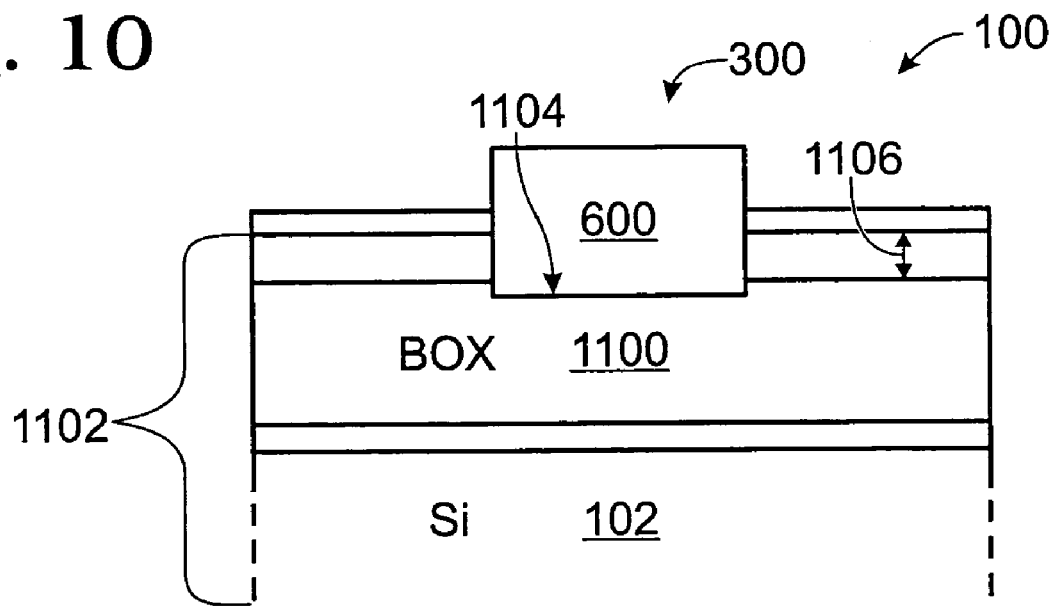
FIG. 10 is a partial cross-sectional view of the present invention strained-Si channel CMOS device STI oxide region, using a SGOI substrate.

FIG. 10 is a partial cross-sectional view of the present invention strained-Si channel CMOS device STI oxide region, using a SGOI substrate. The process steps explaining FIGS. 1 through 9 are applicable to FIG. 10, and are not repeated in the interest of brevity. Neither are the transistor structures depicted in FIGS. 8 and 9 shown. A buried oxide (BOX) layer 1100 is interposed between the Si substrate 102 and the relaxed SiGe layer 104. The BOX 1100, relaxed-SiGe layer 104, and Si substrate 102 form a SiGe on insulator (SGOI) substrate 1102. When the SGOI substrate 1102 is used, the relaxed-SiGe layer 104 has a thickness 1106 in the range of 0.005 microns to 0.5 microns. As shown, the STI trench 300 has a bottom 1104 formed in the BOX 1100. Not shown is the optional permanent oxide layer (see 400, FIG. 4).

Figure 11:
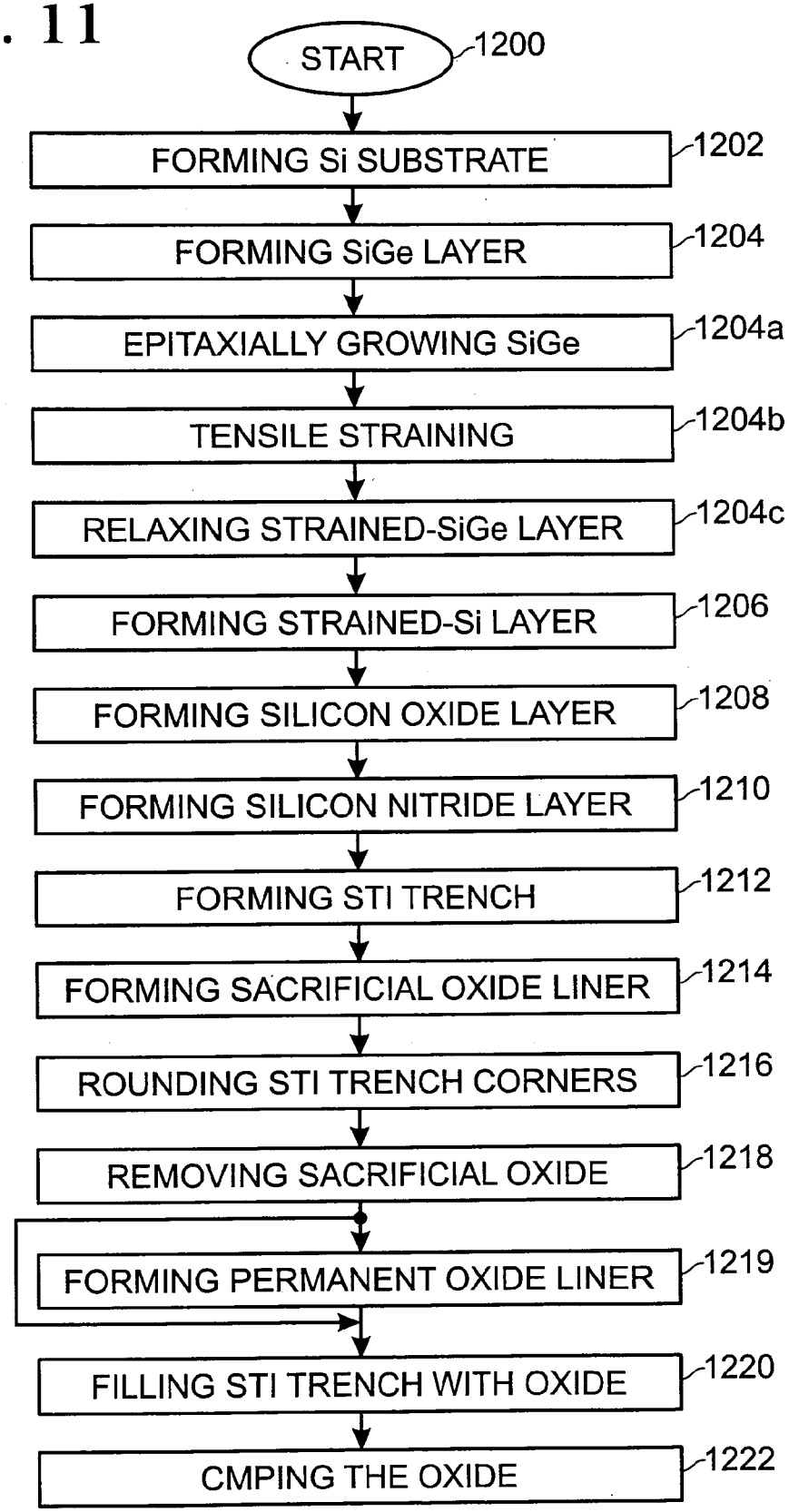
FIG. 11 is a flowchart illustrating the present invention method for forming a STI oxide liner in a strained-silicon channel CMOS device using a relaxed-SiGe layer.

FIG. 11 is a flowchart illustrating the present invention method for forming a STI oxide liner in a strained-silicon channel CMOS device using a relaxed-SiGe layer. Although the method is depicted as a sequence of numbered steps for clarity, no order should be inferred from the numbering unless explicitly stated. It should be understood that some of those steps may be skipped, performed in parallel, or performed without the requirement of maintaining a strict order of sequence. The method starts at Step 1200.

Step 1202 forms a Si substrate. In some aspects of the method, forming a silicon (Si) substrate in Step 1202 includes forming a single crystal Si substrate (either n-type or p-type). Step 1204 forms a relaxed-SiGe layer overlying the Si substrate. Step 1206 forms a strained-Si layer overlying the relaxed-SiGe layer. Step 1208 forms a (temporary) silicon oxide layer overlying the strained-Si layer. Step 1210 forms a (temporary) silicon nitride layer overlying the silicon oxide layer. Step 1212 etches the silicon nitride layer, the silicon oxide layer, the strained-Si layer, and the relaxed-SiGe layer, forming a STI trench with trench corners and a trench surface. Step 1214 forms a sacrificial oxide liner on the STI trench surface. Step 1216, in response to forming the sacrificial oxide liner, rounds and reduces stress at the STI trench corners. Step 1218 removes the sacrificial oxide liner. Step 1220 fills the STI trench with silicon oxide.

Typically, the STI trench is filled with silicon oxide using a chemical vapor deposition (CVD) process. Step 1222, following the filling of the STI trench, chemical-mechanical polishes (CMPs) the silicon oxide, stopping on the silicon nitride layer.

In some aspects, forming a relaxed-SiGe layer overlying the Si substrate in Step 1204 includes substeps. Step 1204*a* epitaxially grows a strained-SiGe layer having a thickness of less than 0.5 microns. Step 1204*b* tensile strains the grown SiGe layer. Step 1204*c* relaxes the strained-SiGe with respect to the underlying Si substrate through an interface dislocation process including hydrogen implantation, followed by an annealing. A heavy dose of hydrogen, in the order of $1\times10^{16}/cm^2$ to $4\times10^{16}/cm^2$, is implanted into the substrate at a projected depth of slightly deeper than the thickness of the strained $Si_{1-x}Ge_x$ layer 104. The SiGe is relaxed with an annealing at a temperature of 700° C. to 900° C., for 15 minutes to 60 minutes. This step may be incorporated into the gate oxide process. There are other conventional relaxation techniques known in the art that could also be used.

Alternately, Step 1204 initially forms the SiGe in the relaxed state through a process of spontaneously relaxing the SiGe by growing a sufficiently thick layer of graded SiGe, of approximately 1–7 microns for example, or growing the SiGe on a low temperature Si buffer, interposed between the Si substrate and the SiGe, where the Si buffer temperature is 400 degrees C., or less.

In other aspects, forming a relaxed-SiGe layer overlying the Si substrate in Step 1204 includes forming a SiGe layer having a top surface with a Ge content in the range between 10 and 50%.

When Step 1202 includes forming a bulk Si substrate, then forming a relaxed-SiGe layer overlying the Si substrate in Step 1204 includes forming a SiGe layer having a thickness in the range of 0.1 micron to 7 microns. Also, Step 1212 of forming the STI trench includes forming the STI trench bottom in the Si substrate. Alternately, the STI trench bottom is formed in the SiGe layer.

In other aspects, forming a relaxed-SiGe layer overlying the Si substrate in Step 1204 includes forming a SiGe on insulator (SGOI) substrate, with a BOX layer interposed between the Si substrate and the SiGe layer. When a SGOI substrate is formed, Step 1204 includes forming a relaxed-SiGe layer having a thickness in the range of 0.005 to 0.5 microns. Forming a STI trench in Step 1212 includes forming the STI trench bottom in the BOX underlying the strained-SiGe layer.

In some aspects of the method, forming a relaxed-SiGe layer overlying the Si substrate in Step 1204 includes forming a relaxed-SiGe layer having a variably graded content from a SiGe layer bottom surface to a SiGe top surface, or a constant content throughout the SiGe layer thickness.

In other aspects, forming a strained-Si layer overlying the relaxed-SiGe layer in Step 1206 includes substeps (not shown). Step 1206a epitaxially grows a layer of Si overlying the strained-SiGe layer. Step 1206b tensile strains the grown Si layer. Typically, Step 1206 includes growing a strained-Si layer having a thickness in the range of 30 to 3000 Å.

In some aspects, forming a silicon oxide layer overlying the strained-Si layer in Step 1208 includes forming the silicon oxide layer through by either CVD, or by thermally oxidizing the underlying strained-Si layer.

In some aspects, forming a sacrificial oxide liner on the STI trench surface in Step 1214 includes forming a sacrificial oxide liner having a thickness in the range of 20 to 300 Å. Typically, Step 1214 includes forming the sacrificial oxide liner through a thermal oxidation process at a temperature in the range of 300 to 1100 degrees C.

In some aspects, removing the sacrificial oxide liner in Step 1218 includes using a hydrofluoric (HF) process with either an HF vapor or an HF solution.

Optionally, the method may comprise Step 1219. Step 1219, following the removal of the sacrificial oxide liner, forms a permanent oxide liner on the STI trench surface. Then, filling the STI trench with silicon oxide in Step 1220 includes depositing silicon oxide in the STI trench overlying the permanent oxide liner. Typically, forming a permanent oxide liner in the STI trench (Step 1219) includes forming a permanent oxide liner having a thickness of less than 100 Å.

A strained-Si channel CMOS device shallow trench isolation (STI) oxide region and a method for forming the same have been provided. Fabrication process specifics have primarily been provided that specifically describes just the formation of the STI region. However, it would be within the normal skill of one working in the art to extend and apply the STI structures to structures separating conventional MOS transistors, where strained-Si is used in the channel and a SiGe layer acts as a virtual substrate. Other variations and embodiments of the invention will occur to those skilled in the art.

We claim:

1. A strained-silicon (Si) channel CMOS device shallow trench isolation (STI) oxide region comprising:
    a silicon (Si) substrate;
    a relaxed-silicon germanium (SiGe) layer overlying the Si substrate;
    a strained-Si layer immediately overlying the relaxed-SiGe layer;
    a STI trench with a trench surface etched completely through the strained-Si and relaxed-SiGe layers;
    a sacrificial oxide liner, temporarily formed on the STI trench surface;
    silicon oxide fill in the STI trench; and,
    a gate oxide layer immediately overlying the strained-Si layer.

2. The STI oxide region of claim 1 wherein the Si substrate is a single crystal Si substrate.

3. The STI oxide region of claim 1 wherein the relaxed-SiGe layer has a top surface with a Ge content in the range between 10% and 50%.

4. The STI oxide region of claim 1 wherein the Si substrate is a bulk silicon substrate; and,
    wherein the relaxed-SiGe layer has a thickness in the range of 0.1 microns to 7 microns.

5. The STI oxide region of claim 1 wherein the strained-Si layer has a thickness in the range of 30 Å to 300 Å.

6. The STI oxide region of claim 1 wherein the sacrificial oxide liner has a temporary thickness in the range of 20 Å to 300 Å.

7. The STI oxide region of claim 1 wherein the relaxed-SiGe layer has a bottom surface, a top surface, and a variably graded Ge content between the bottom and top surfaces.

8. The STI oxide region of claim 1 wherein the relaxed-SiGe layer has a constant Ge content throughout the SiGe layer thickness.

9. The STI oxide region of claim 1 further comprising:
    a permanent oxide liner interposed between the STI trench and the silicon oxide trench fill.

10. The STI oxide region of claim 9 wherein the permanent oxide liner has a thickness of less than 100 Å.

11. The STI oxide region of claim 1 wherein the relaxed-SiGe layer and Si substrate form a SiGe on insulator (SGOI) substrate, with a buried oxide (BOX) layer interposed between the SiGe layer and the Si substrate.

12. The STI oxide region of claim 11 wherein the relaxed-SiGe layer has a thickness in the range of 0.005 microns to 0.5 microns.

13. The STI oxide region of claim 11 wherein the STI trench has a bottom formed in the BOX.

14. The STI oxide region of claim 1 further comprising:
    a temporary silicon oxide layer overlying the strained-Si layer; and,
    a temporary silicon nitride layer overlying the silicon oxide layer.

15. The STI oxide region of claim 1 wherein the STI trench has a bottom formed in the relaxed-SiGe layer.

16. The STI oxide region of claim 1 wherein the STI trench has a bottom formed in the Si substrate.

17. A strained-silicon (Si) channel CMOS device shallow trench isolation (STI) oxide region comprising:
    a silicon (Si) substrate;
    a relaxed-silicon germanium (SiGe) layer overlying the Si substrate;
    a strained-Si layer overlying the relaxed-SiGe layer;
    a STI trench with a trench surface etched through the strained-Si layer and the relaxed-SiGe layer, with a bottom formed in the Si substrate;
    a sacrificial oxide liner, temporarily formed on the STI trench surface; and,
    silicon oxide fill in the STI trench.

18. A strained-silicon (Si) channel CMOS device shallow trench isolation (STI) oxide region comprising:
    a silicon (Si) substrate;
    a relaxed-silicon germanium (SiGe) layer overlying the Si substrate;
    a strained-Si layer overlying the relaxed-SiGe layer;
    a STI trench with a trench surface etched completely through the strained-Si and relaxed-SiGe layers;
    a permanent oxide liner formed on the STI trench surface; and,
    silicon oxide fill overlying the permanent oxide liner.

* * * * *